United States Patent [19]

Kaiser

[11] Patent Number: 5,281,846
[45] Date of Patent: Jan. 25, 1994

[54] ELECTRONIC DEVICE HAVING A DISCRETE CAPACITOR ADHERENTLY MOUNTED TO A LEAD FRAME

[75] Inventor: Ulrich Kaiser, Freising, Fed. Rep. of Germany

[73] Assignee: Texas Instruments Deutschland GmbH, Freising, Fed. Rep. of Germany

[21] Appl. No.: 986,886

[22] Filed: Dec. 3, 1992

Related U.S. Application Data

[63] Continuation of Ser. No. 699,830, May 14, 1991, abandoned.

[51] Int. Cl.[5] ............................................. H01L 23/02
[52] U.S. Cl. ................................. 257/528; 257/532; 257/676; 361/306.1
[58] Field of Search ...................... 357/74, 72, 70; 257/924, 796, 532, 528, 676, 783; 361/306, 386

[56] References Cited

U.S. PATENT DOCUMENTS

| | | | |
|---|---|---|---|
| 4,249,196 | 2/1981 | Durney et al. | 357/74 |
| 4,714,952 | 12/1987 | Takekawa et al. | 357/70 |
| 4,933,744 | 6/1990 | Segawa et al. | 357/72 |
| 4,989,117 | 1/1991 | Hernandez | 257/787 |
| 4,994,936 | 2/1991 | Hernandez | 257/796 |

FOREIGN PATENT DOCUMENTS

| | | |
|---|---|---|
| 0180219 | 7/1986 | European Pat. Off. . |
| 3626151.3 | 2/1988 | Fed. Rep. of Germany . |
| 2091035A | 7/1982 | United Kingdom . |

Primary Examiner—William Mintel
Assistant Examiner—Roy Potter
Attorney, Agent, or Firm—Rebecca A. Mapstone; James C. Kesterson; Richard L. Donaldson

[57] ABSTRACT

An electronic component includes on a lead frame (10) a semiconductor chip (22) and at least one capacitor (14) electrically connected to the semiconductor chip (22). The capacitor is a flat capacitor which has an overall height small in comparison with its length and its width and which is provided on its upper and lower faces with a respective connecting contact area (16, 18). The capacitor (14) is mounted with its lower face in electrically conductive connection on the lead frame (10) and the semiconductor chip (22) is mounted in electrically conductive connection on the upper face of the capacitor (14).

8 Claims, 1 Drawing Sheet

ELECTRONIC DEVICE HAVING A DISCRETE CAPACITOR ADHERENTLY MOUNTED TO A LEAD FRAME

This application is a continuation of application Ser. No. 07/699,830 filed May 14, 1991, now abandoned.

The invention relates to an electronic component comprising a semiconductor chip mounted on a lead frame and at least one capacitor electrically connected to the semiconductor chip.

U.S. patent application Ser. No. 655,182 filed Feb. 13, 1991 for Transponder Arrangement, a continuation of U.S. patent application Ser. No. 216,756 filed Jul. 8, 1988 and incorporated herein by reference, discloses a transponder arrangement which comprises an interrogation unit and a responder. For one application the responder has very small dimensions because it is intended for implantation in living animals to enable the individual animals to be identified by transmitting an interrogation signal with the interrogation unit, to which the responder then replies with individual response signals by which the animals can be identified.

A particular feature of the responder of the known transponder arrangement is that it does not have its own power source but obtains the energy it requires for transmitting back its response signal from the interrogation pulse which has been transmitted by the interrogation unit. For this purpose, in the responder the interrogation pulse received by means of a resonance circuit is rectified and the energy contained in the interrogation pulse stored in a capacitor which then represents the energy source for sending back the response signal. Since the responder has very small dimensions, the relatively large capacitor serving for the energy storage and the semiconductor chip containing the electronic circuit of the responder must be accommodated in very restricted space. In the known responder the semiconductor chip is mounted on a lead frame. This constructional unit of semiconductor chip and lead frame is embedded in a plastic composition which serves as housing out of which the necessary leads project. The capacitor serving for the energy storage is soldered directly to said leads. In the same manner, the resonance circuit consisting of a coil and a capacitor is soldered directly to the leads. Because of the small dimensions, attaching these circuit elements to the leads is difficult and can lead to errors (solder bridges and the like).

The invention is based on the problem of providing such an electronic component which can be made with very small dimensions without impairing its functionability on assembly.

The invention provides a structure in which a flat capacitor having an overall height small in comparison with its peripheral length has contact areas on its exposed flat faces. The capacitor is mounted on a lead frame with the contact area on one face in electrically conductive connection with one or more electrical conductors of the lead frame. The semiconductor chip, for example an integrated circuit chip, is disposed on and adherently attached to the other, opposed face of the capacitor such that the perimeter of the semiconductor chip is substantially accommodated within (i.e., does not significantly project beyond) the perimeter of the capacitor.

In an alternative arrangement, two or more semiconductor chips may be mounted on and adherently attached to said other opposed face of the capacitor and accommodated within the perimeter of the capacitor. In another arrangement, one or more semiconductor chips could be mounted on and adherently attached to two or more flat capacitors (disposed laterally with respect to each other) mounted on and in electrically conductive connection with conductors of the lead frame. In either case, the semiconductor chip(s) is or are accommodated substantially within the overall perimeter occupied by the capacitor(s).

In a particular embodiment of, the invention a capacitor formed in particular manner is arranged directly on the lead frame and one or more semiconductor chips are in turn arranged directly on the capacitor. Suitably, the capacitor and semiconductor chip may both be rectangular with the latter having length and width dimensions not greater than those of the capacitor and arranged so that the perimeter of the semiconductor chip does not extend beyond the perimeter of the capacitor. With this construction, no problems are encountered in establishing electrical connections between the lead frame and the one contact area of the capacitor on the one hand and between the other contact area of the capacitor and the semiconductor chip on the other hand. The steps necessary for the assembly can be carried out in simple manner and give moreover a very stable structure.

The semiconductor chip(s) may be adherently attached to the flat capacitor(s) by an electrically conductive adhesive to provide an electrical connection between the chip(s) and the capacitor(s). If such electrical connection is not required, an electrically insulating adhesive may be used instead.

The invention will now be explained with reference to the drawings in which.

Figure 1:
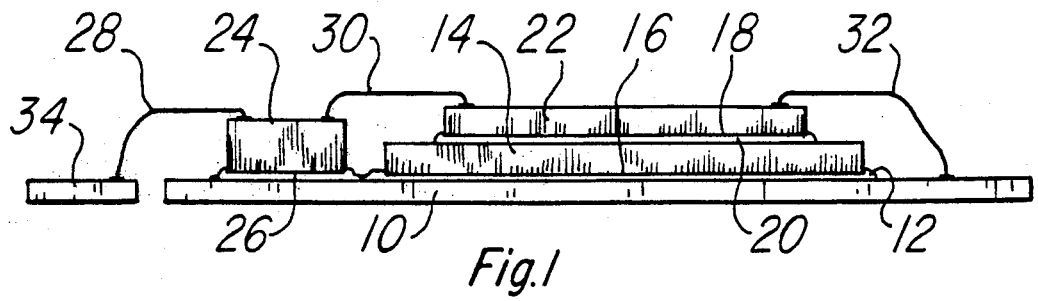
FIG. 1 shows a side view of an embodiment of an electronic component according to the invention.
Figure 2:
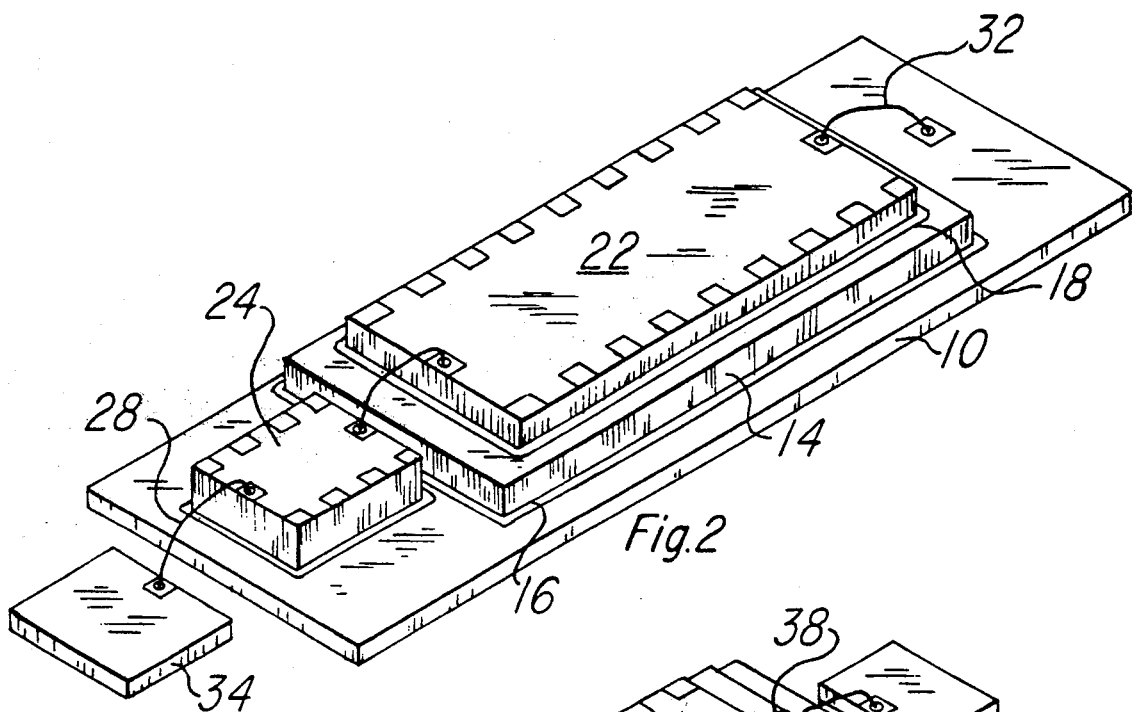
FIG. 2 is an isometric view of the component shown in FIG. 1.

In FIGS. 1 and 2, a compact structure of an electronic component is illustrated. The component includes a lead frame 10 as usually employed as support for integrated circuits. On the lead frame 10 a capacitor 14 is mounted by means of a layer 12 of an electrically conductive adhesive. The capacitor 14 is a flat capacitor having a width and length large compared with the overall height thereof. The capacitor 14 has both on its lower face and on its upper face a respective connection contact area 16 and 18 with the aid of which the capacitor 14 can be connected to the respective associated electronic circuit. The lower connection contact area 16 is connected in the example shown by means of the electrically conductive adhesive 12 to the lead frame 10.

By means of a further layer 20 of an electrically conductive adhesive, a semiconductor integrated circuit chip 22 is mounted on the capacitor 14, the electrically conductive adhesive 20 establishing an electrical connection between the lower surface of the semiconductor chip 22 and the upper connection contact area 18 of the capacitor 14. The chip 22 has length and width dimensions not greater than the length and width dimensions of the capacitor 14 so that the perimeter of the chip 22 is accommodated within the perimeter of the capacitor 14.

To a side of the stack comprising the capacitor 14 and the semiconductor chip 22, a further capacitor 24 may be arranged on a conductor of the lead frame 10, said capacitor 24 also being a flat capacitor which like the capacitor 14 is electrically connected with its lower connection contact area 26 via the layer 12 to the lead frame.

With the aid of bond wires 28, 30, 32, connections necessary for a required circuit function can be established between leads of the lead frame 10 or a further conductor 34 of the lead frame 10 separate therefrom as well as between the capacitor 24 and the semiconductor chip 22.

In one embodiment, the semiconductor chip 22 may be an integrated circuit chip embodying the circuit elements of a transponder as described in more detail in U.S. patent application Ser. No. 655,182 and incorporated herein by reference.

The arrangement illustrated in FIGS. 1 and 2 can be embedded in a plastic composition to form a housing out of which only a few parts of the lead frame 10, 34 project for establishing outer terminal connections.

The compact accommodation described of a relatively large capacitor together with a semiconductor chip in an electronic component is suitable for all applications where there is only little space for accommodating a relatively large capacitor. As already explained at the beginning, such a use is present in a batteryless responder of a transponder arrangement in which the responder is to be implanted in living animals and for this reason must have very small dimensions. Accordingly, the structure described with reference to FIGS. 1 and 2 may be used to implement the circuit arrangement of the transponder described in the above-mentioned U.S. patent application Ser. No. 655,182.

Figure 3:
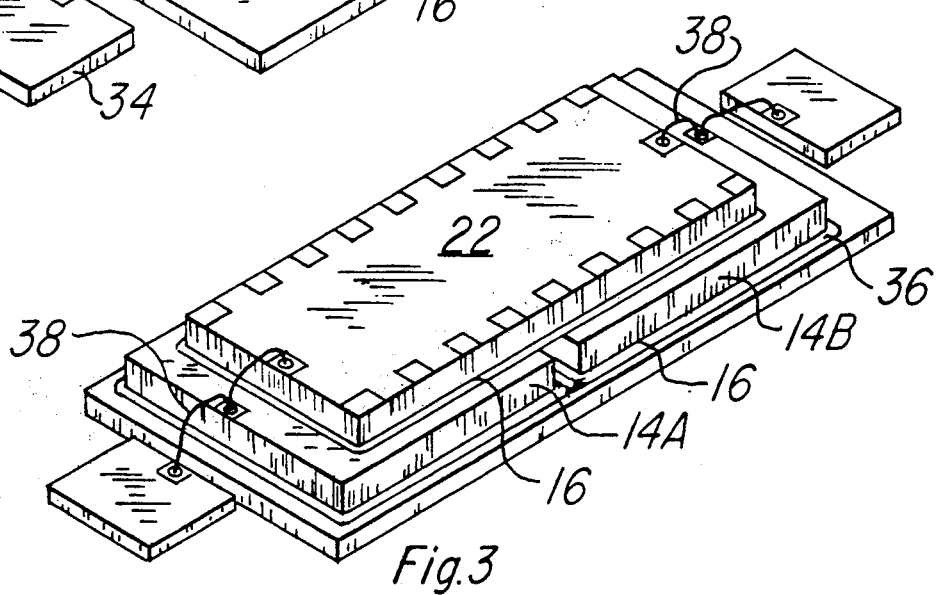
FIG. 3 is an isometric view of an alternative embodiment of the present invention.

The embodiment of the invention described above may be modified in various ways. For example, two or more integrated circuit chips may be mounted on and in electrically conductive attachment to the upper surface of the flat capacitor so that the chips do not significantly project beyond the perimeter of the capacitor. Alternatively, as shown in FIG. 3 one or more integrated circuit chips 22 could be mounted on and adherently attached to the upper surfaces of side-by-side disposed flat capacitors 14A and 14B mounted on a lead frame and in electrically conductive connection with one or more leads of the lead frame. As illustrated, the integrated circuit chip is adherently attached to the underlying flat capacitors using an electrically insulating adhesive 36 and electrical connections between the chip and the capacitors are effected by bond wires 38.

While rectangular configurations for the capacitor and integrated circuit chip have been exemplified, these are not critical.

What is claimed is:

1. An electronic component comprising:
   a lead frame having a plurality of electrical conductors;
   a first discrete capacitor having opposed substantially flat surfaces, said opposed flat surfaces including connection contact areas, one of the connection contact areas on one of the flat surfaces of said discrete capacitor adherently attached to at least one of said electrical conductors on said lead frame with a first layer of an electrically conductive material therebetween; and
   at least one semiconductor chip adherently attached to and in electrical connection with the other of said opposed surfaces of said capacitor by a second layer of an electrically conductive material therebetween.

2. An electrical component according to claim 1, wherein the overall height of said capacitor is small in comparison with its perimeter width, and wherein each semiconductor chip is substantially accommodated within the perimeter of the capacitor.

3. An electrical component according to claim 1, wherein the semiconductor chip and the capacitor each have a rectangular perimeter and the semiconductor chip does not project substantially beyond the perimeter of the capacitor.

4. An electronic component according to claim 1, wherein the at least one semiconductor chip has lengthwise sides oriented in substantially parallel relation with lengthwise sides of the capacitor.

5. An electrical component according to claim 1, and further comprising a second discrete chip capacitor mounted on the lead frame.

6. The electronic component of claim 1 and further comprising a second discrete capacitor having opposed substantially flat surfaces with connection contact areas, one of said connection contact areas on one of said opposed surfaces of said second discrete capacitor adherently attached to a least one of said electrical conductors on said lead frame with said first layer of said electrically conductive material.

7. An electrical component according to claim 6, wherein each semiconductor chip is disposed within a perimeter that is substantially accommodated within a perimeter occupied by the said discrete capacitors.

8. The electronic component of claim 1 wherein said first and second layers of electrically conductive material are an adhesive.

* * * * *